(12) United States Patent
Yerger

(10) Patent No.: US 10,218,349 B2
(45) Date of Patent: Feb. 26, 2019

(54) IGBT HAVING IMPROVED CLAMP ARRANGEMENT

(71) Applicant: Littelfuse, Inc., Chicago, IL (US)

(72) Inventor: Justin Michael Yerger, West Warwick, RI (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 15/641,877

(22) Filed: Jul. 5, 2017

(65) Prior Publication Data

US 2017/0373679 A1 Dec. 28, 2017

Related U.S. Application Data

(60) Provisional application No. 62/337,768, filed on May 17, 2016.

(51) Int. Cl.
| | |
|---|---|
| *H03K 17/08* | (2006.01) |
| *H03K 17/082* | (2006.01) |
| *H01L 29/423* | (2006.01) |
| *H03K 5/08* | (2006.01) |
| *H03K 17/081* | (2006.01) |
| *H03K 17/567* | (2006.01) |
| *H01L 29/739* | (2006.01) |

(52) U.S. Cl.
CPC ....... *H03K 17/0828* (2013.01); *H01L 29/423* (2013.01); *H01L 29/42304* (2013.01); *H03K 5/08* (2013.01); *H03K 17/08116* (2013.01); *H03K 17/567* (2013.01); *H01L 29/7393* (2013.01); *H03K 2217/0036* (2013.01)

(58) Field of Classification Search
CPC ................. H03K 17/0828; H03K 5/08; H03K 2217/0036; H01L 29/42304; H01L 29/7393

USPC .......................................................... 327/109
See application file for complete search history.

(56) References Cited

U.S. PATENT DOCUMENTS

| | | | | | |
|---|---|---|---|---|---|
| 4,800,339 | A | * | 1/1989 | Tanimoto ............. | H03F 3/3001 330/253 |
| 5,034,336 | A | * | 7/1991 | Seki .................. | H01L 29/66333 148/DIG. 126 |
| 6,921,958 | B2 | | 7/2005 | Yasuda | |
| 7,332,769 | B2 | * | 2/2008 | Spadea .............. | H01L 29/7393 257/326 |
| 7,723,802 | B2 | * | 5/2010 | Terashima .......... | H01L 27/0647 257/378 |
| 8,093,660 | B2 | * | 1/2012 | Terashima .......... | H01L 27/0248 257/370 |
| 8,189,309 | B2 | | 5/2012 | Duryea | |
| 9,905,558 | B1 | * | 2/2018 | Appaswamy ....... | H01L 27/0722 |
| 2005/0110073 | A1 | * | 5/2005 | Spadea .............. | G11C 16/0416 257/315 |
| 2012/0217541 | A1 | | 8/2012 | Hesieh | |

OTHER PUBLICATIONS

International Search Report and Written Opinion dated Nov. 6, 2017 in corresponding PCT/US2017/041063.

* cited by examiner

*Primary Examiner* — Ryan Jager

(57) ABSTRACT

In one embodiment, an insulated gate bipolar transistor (IGBT) device may include an NMOS portion and a PNP portion, where the PNP portion is coupled to the NMOS portion. The PNP portion may include a base and a collector. The IGBT may further include a flyback clamp, where the flyback clamp is coupled between the base and the collector of the PNP portion.

13 Claims, 1 Drawing Sheet

IGBT HAVING IMPROVED CLAMP ARRANGEMENT

RELATED APPLICATIONS

This Application claims priority to U.S. Provisional Patent Application No. 62/337,768, entitled IGBT Clamping, filed May 17, 2016, and incorporated by reference herein in its entirety.

BACKGROUND

Field

Embodiments relate to the field of semiconductor devices, and more particularly to an insulated gate bipolar transistor device.

Discussion of Related Art

An insulated gate bipolar transistor (IGBT) device is a semiconductor device having four alternating layers (P-N-P-N) that are controlled by a metal-oxide-semiconductor (MOS) gate structure. As such, an IGBT device (also referred to herein as an IGBT) may be considered as a hybrid device that has the output switching and conduction characteristics of a bipolar transistor, while being voltage-controlled as in a metal oxide semiconductor field effect transistor (MOSFET). In particular, an IGBT cell may be constructed similarly to an n-channel vertical power MOSFET (NMOS portion) where the $n^+$ drain is replaced with a $p^+$ collector layer, thus forming a vertical PNP bipolar junction transistor.

In operation, when an IGBT enters an OFF state, the PNP bipolar junction transistor portion ("PNP portion") of the IGBT may be designed to pass a (clamping) current during an inductive flyback period of operation. For example, known designs for IGBTs may employ a clamp structure that turns on the NMOS portion of the IGBT in a linear mode to enable the PNP portion to pass clamping current. Turning on the NMOS in linear mode during an inductive flyback period may be very stressful on the IGBT device due to the high voltage/high current condition, and can limit the energy performance and robustness capability of the IGBT device.

It is with respect to these and other considerations, the present disclosure is provided.

SUMMARY

In one embodiment, an insulated gate bipolar transistor (IGBT) device is provided. The IGBT may include an NMOS portion and a PNP portion, where the PNP portion is coupled to the NMOS portion. The PNP portion may include a base and a collector. The IGBT may further include a flyback clamp, where the flyback clamp is coupled between the base and collector of the PNP portion.

In another embodiment, a method of operating an insulated gate bipolar transistor (IGBT) is provided. The method may include switching the IGBT from an ON state to an OFF state; and turning on a PNP portion of the IGBT in the OFF state, wherein an NMOS portion of the IGBT is maintained in an OFF condition during flyback clamping in the OFF state.

DESCRIPTION OF EMBODIMENTS

Figure 1:
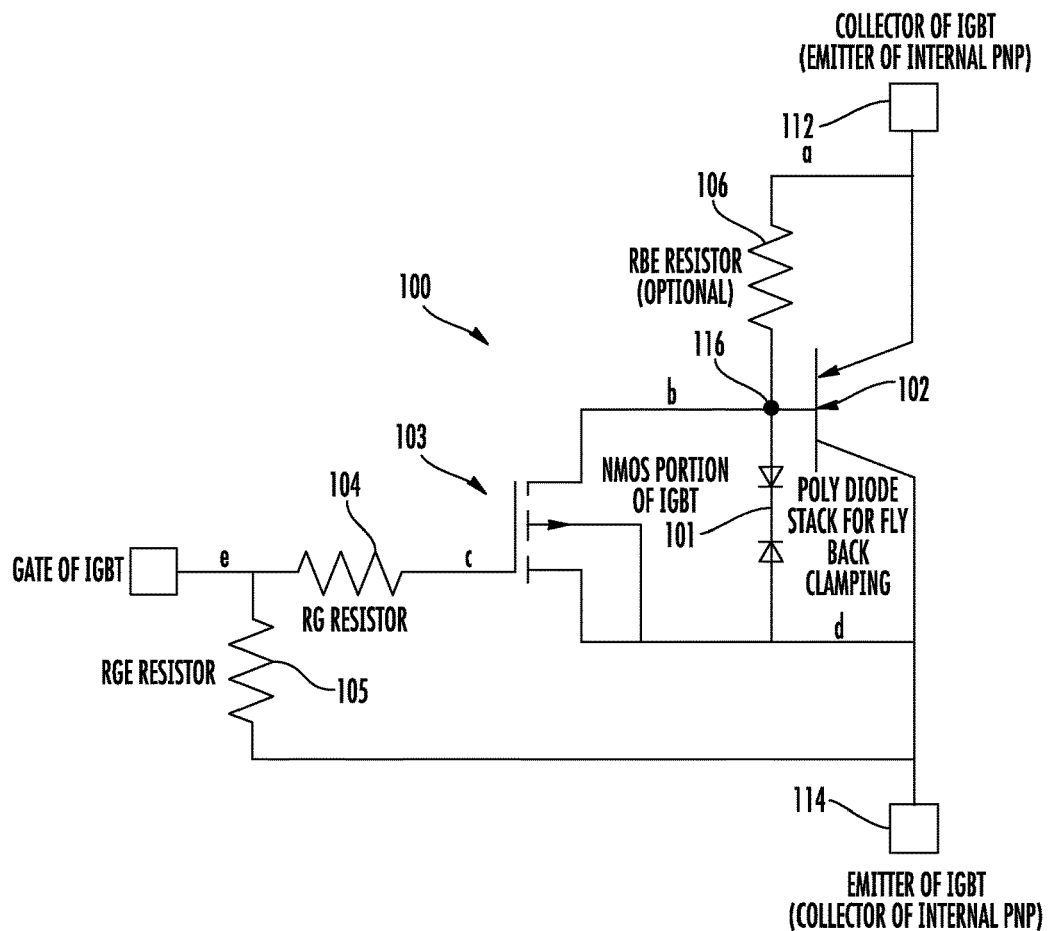
FIG. 1 presents a circuit representation of one implementation of an IGBT according to embodiments of the disclosure.

The present embodiments will now be described more fully hereinafter with reference to the accompanying drawings, in which various embodiments are shown. The embodiments may be embodied in many different forms and are not to be construed as limited to the embodiments set forth herein. These embodiments are provided so that this disclosure will be thorough and complete, and will fully convey the scope of the embodiments to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate when two or more elements are in direct physical contact with one another. The terms "on,", "overlying," "disposed on," and over, may also mean when two or more elements are not in direct contact with one another. For example, "over" may mean when one element is above another element and not in contact with another element, and may have another element or elements in between the two elements. Furthermore, the term "and/or" may mean "and", it may mean "or", it may mean "exclusive-or", may mean "one", may mean "some, not all", may mean "neither", and/or it may mean "both." The scope of claimed subject matter is not limited in this respect.

The present embodiments are generally related to improved IGBT devices, or simply, "IGBTs." Among the improvements afforded by the present embodiments are improved energy handling and robustness. According to various embodiments, a novel clamping circuitry is provided in an IGBT that facilitates maintaining the NMOS portion of the IGBT in an OFF state during flyback clamping. In particular embodiments, the IGBT may enter flyback clamping by use of a diode stack to turn on the PNP portion. The diode stack may draw base current instead of the NMOS device. The energy handling performance during a single pulse unclamped inductive switching (UIS) event or repetitive UIS may be improved by leaving the NMOS portion of the IGBT in the OFF state during flyback clamping. Some embodiments of the present disclosure may include a base-to-emitter pull-up resistor to provide improved ICES leakage performance.

Referring now to FIG. 1, there is shown a circuit representation of an IGBT 100 according to embodiments of the disclosure. In the embodiment of FIG. 1, the IGBT 100 includes a PNP portion 102, an NMOS portion 103, and an RG resistor 104, connected to the gate of the NMOS portion 103. The IGBT 100 may further include an RGE resistor 105 coupled between the gate and collector 114 of the PNP portion 102 of the IGBT 100. Notably, the collector 114 of the PNP portion 102 may be equivalent to the emitter of the IGBT 100, and the emitter 112 of the PNP portion 102 may be equivalent to the collector of the IGBT 100, as in known devices. Additionally, a flyback clamp 101 may be coupled to the base and drain (collector 114) of the PNP portion 102 of an IGBT 100.

As illustrated in FIG. 1, some embodiments may include a resistor 106, coupled between the emitter 112 and base 116 of the PNP portion 102 of the IGBT 100. This optional resistor may lower current leakage. In addition, some embodiments may omit the RG resistor 104. Removing the RG resistor 104 may increase switching speed.

In various embodiments, the flyback clamp 101 may be implemented as a diode stack, such as a pair of polysilicon diodes formed from polysilicon (poly diode stack). As shown, the opposed diodes are formed wherein the opposed cathodes are connected to one another in a cathode-to-cathode configuration.

Figure 2:
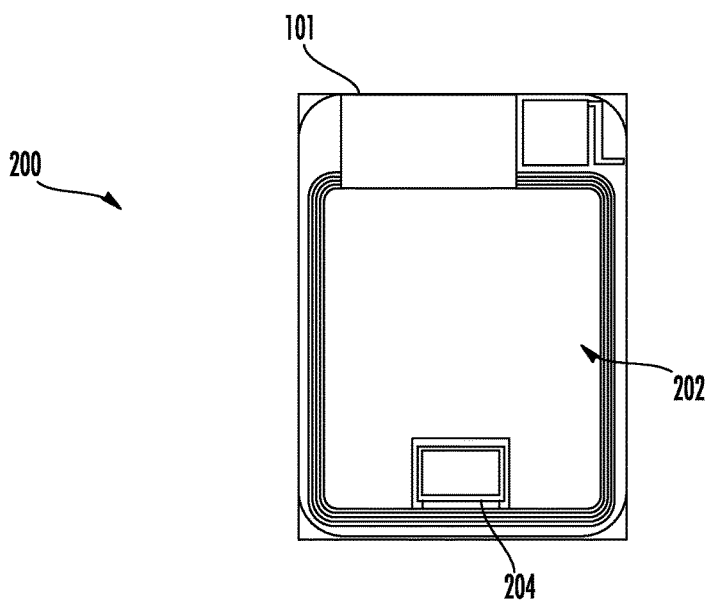
FIG. 2 presents a plan view of an IGBT according to various embodiments of the disclosure.

Referring now to FIG. 2 there is shown a plan view of an IGBT 200 according to embodiments of the disclosure. The IGBT 200 is integrated into a semiconductor die and includes a flyback clamp implemented as a poly diode stack, as discussed above. The IGBT 200 in particular may be designed with a wide flyback clamp, shown as flyback clamp 101, that carries all base current or a majority of the base current of a PNP portion of the IGBT 200. Also shown are the emitter region 202 and the gate 204.

In particular, some embodiments may include the resistor 106 as an integrated base-emitter resistor integrated into a semiconductor die (semiconductor substrate) forming the IGBT 100 or IGBT 200, such as a silicon substrate. As shown in FIG. 1, the resistor 106 is disposed between the base and the emitter of the PNP portion 102. The integrated base-emitter resistor may improve ICES leakage (collector/emitter leakage with base shorted to emitter) at elevated voltages. The resistor 106 may function to hold off VBE (base-emitter voltage) of the PNP portion 102 at voltages that approach the clamp voltage. The resistor 106 may reduce the beta-multiplied current into the collector 114 of the PNP portion 102.

In some embodiments, an IGBT may direct PNP base current through an epitaxial layer contact ring. Redirecting the PNP base current may reduce current crowding or power dissipation within the core of the IGBT.

In some embodiments, an IGBT may be arranged wherein the substrate and layer stack forming the various components of the IGBT are similar to or the same as known IGBTs, in terms of thickness and composition. Because of the provision of the presence of a flyback clamp implemented as described above, and/or the directing of PNP base current through an epitaxial layer contact ring, the NMOS portion of the IGBTs of the present embodiments may be stable and robust during a high power event. An example of a high power event may be when VGs (gate-source voltage) is 0V and $V_{DS}$ (source-drain voltage) is above 400V. In various embodiments, the power dissipation across a flyback clamp implemented as a diode stack between the base and collector of a PNP portion of an IGBT may be evenly distributed. An example of power dissipation across the diode stack may be approximately 6.5V per diode segment multiplied by the current. These voltage values are merely an illustrative example of one implementation of the present disclosure. Embodiments of the present disclosure may use different high power event voltage levels or different distribution of voltages across the diode stack.

Embodiments of the present disclosure may have improved energy handling capabilities during a flyback event. Some embodiments may improve the unclamped inductive spike rating or the self-clamped inductive switching energy capability. By virtue of the architecture and circuit arrangement of the present embodiments the operation of the integrated MOSFET portion (such as an NMOS) of an IGBT may be avoided during an inductive flyback event, thus reducing the risk of the MOSFET portion being damaged. Some embodiments may withstand a single pulse maximum energy-handling event or a lifetime repetitive clamping test. The present disclosure may find applicability in, as just one example, automotive ignition IGBTs, or in other IGBT applications as well.

While the present embodiments have been disclosed with reference to certain embodiments, numerous modifications, alterations and changes to the described embodiments are possible without departing from the sphere and scope of the present disclosure, as defined in the appended claims. Accordingly, the present embodiments may not be limited to the described embodiments, but have the full scope defined by the language of the following claims, and equivalents thereof.

What is claimed is:

1. An insulated gate bipolar transistor (IGBT) device, comprising:
   an NMOS portion;
   a PNP portion, coupled to the NMOS portion, wherein the PNP portion comprising a base and a collector; and
   a flyback clamp, coupled between the base and the collector of the PNP portion, wherein the flyback clamp comprises a diode stack, wherein the diode stack includes pair of diodes, arranged in a cathode-to-cathode configuration.

2. The IGBT device of claim 1, wherein the pair of diodes comprise polysilicon diodes.

3. The IGBT device of claim 1, further comprising a base-emitter resistor, coupled between the base and an emitter of the PNP portion.

4. The IGBT device of claim 3, wherein the IGBT device comprises a semiconductor substrate, wherein the base-emitter resistor is an integrated base-emitter resistor, the integrated base-emitter resistor being integrated into the semiconductor substrate.

5. The IGBT device of claim 1, further comprising an RG resistor, the RG resistor being connected to the gate of the NMOS portion.

6. The IGBT device of claim 1, wherein the flyback clamp is disposed to maintain the NMOS portion in an OFF state during an inductive flyback period of operation of the IGBT.

7. The IGBT device of claim 6, wherein the flyback clamp is disposed to turn on the PNP portion during the inductive flyback period.

8. The IGBT device of claim 1, wherein the flyback clamp is configured to carry at least a majority of a base current flowing through the PNP portion.

9. Thu IGBT device of claim 1, further comprising an epitaxial layer contact ring, wherein the IGBT device is configured to redirect at least a portion of a base current of the PNP portion through the epitaxial layer contact ring.

10. A method of operating an insulated gate bipolar transistor (IGBT), comprising:
    switching the IGBT from an ON state to an OFF state; and
    turning on a PNP portion of the IGBT in the OFF state, wherein an NMOS portion of the IGBT, coupled to the PNP portion, is maintained in an OFF condition during flyback clamping in the OFF state, wherein the PNP portion is turned on by a flyback clamp arranged between a base and a collector of the PNP portion, wherein the flyback clamp comprises a diode stack, wherein the diode stack includes pair of diodes, arranged in a cathode-to-cathode configuration.

11. The method of claim 10, wherein the pair of diodes comprise polysilicon diodes.

12. The method of claim 10, further comprising providing a base-emitter resistor between a base and an emitter of the PNP portion, wherein beta-multiplied current is reduced into a collector of the PNP portion as compared to a configuration of the IGBT lacking the base-emitter resistor.

13. The method of claim 10, further comprising redirecting base current in the PNP portion of the IGBT during the flyback clamping through an epitaxial layer contact ring, wherein at least one of current crowding and power dissipation is reduced in a core of the IGBT.

\* \* \* \* \*